United States Patent [19]

Kirschner

[11] 4,131,806
[45] Dec. 26, 1978

[54] I.I.L. WITH INJECTOR BASE RESISTOR AND SCHOTTKY CLAMP

[75] Inventor: Nikolaus Kirschner, Johannesburg, South Africa

[73] Assignee: Siemens Aktiengesellschaft, Berlin & Munich, Germany

[21] Appl. No.: 700,534

[22] Filed: Jun. 28, 1976

[30] Foreign Application Priority Data

Jul. 7, 1975 [DE] Fed. Rep. of Germany ....... 2530288

[51] Int. Cl.² ........................................... H01L 27/04
[52] U.S. Cl. .................................... 307/215; 357/15; 357/44; 357/46; 357/92
[58] Field of Search ...................... 357/35, 36, 15, 44, 357/46, 49, 4, 50; 307/215

[56] References Cited

U.S. PATENT DOCUMENTS

| 3,569,800 | 3/1971 | Collins | 357/36 |
| 3,573,573 | 4/1971 | Moore | 357/36 |
| 3,631,309 | 12/1971 | Myers | 357/36 |
| 3,654,530 | 4/1972 | Lloyd | 357/36 |
| 3,736,477 | 5/1973 | Berger et al. | 357/44 |
| 3,879,745 | 4/1975 | Tharmaratnam | 357/36 |
| 3,956,641 | 5/1976 | Berger et al. | 357/35 |
| 4,009,397 | 2/1977 | Mulder et al. | 357/15 |

FOREIGN PATENT DOCUMENTS 2512737  10/1975  Fed. Rep. of Germany ............. 357/44

OTHER PUBLICATIONS

Blatt et al., IEEE IEDM Tech. Digest, Dec. 1974, pp. 511-514.
Berger et al., IEEE ISSCC, Feb. 1975, Dig. of Tech. Papers, pp. 172-173.
Anantha et al., IBM Tech. Discl. Bull., vol. 14, No. 1, Jun. 1971, pp. 96-97.

Primary Examiner—William D. Larkins
Attorney, Agent, or Firm—Hill, Gross, Simpson, Van Santen, Steadman, Chiara & Simpson

[57] ABSTRACT

This invention relates to an inverter with a lateral bipolar pnp (npn) transistor and a vertical, bipolar npn (pnp) transistor which vertical transistor has at least one collector. The collector of the lateral transistor is connected integrally with the base of the vertical transistor. The emitter of the vertical transistor is connected to one terminal of a supply voltage source, and the emitter of the lateral transistor is connected to the other terminal of the supply voltage source. A resistance is connected between the base of the lateral transistor and the said one terminal of the supply voltage source.

The inverter is formed in an integrated circuit which includes a substrate which is preferably a semiconductor on which both a pnp (npn) lateral transistor and an npn (pnp) vertical transistor are formed in an epitaxial layer which has been deposited on the substrate. A portion of the emitter of the vertical transistor forms the base of the lateral transistor. A portion of the collector of the lateral transistor forms the base of the vertical transistor. The emitter of the vertical transistor is located as a buried layer, while the collectors of the vertical transistor are located at the surface of the epitaxial layer.

3 Claims, 4 Drawing Figures

I.I.L. WITH INJECTOR BASE RESISTOR AND SCHOTTKY CLAMP

BACKGROUND OF AND SUMMARY OF THE INVENTION

This invention relates to an inverter stage in an integrated injection logic which includes a lateral bipolar pnp (npn) transistor and a vertical, bipolar npn (pnp) transistor which vertical transistor has at least one collector. The collector of the lateral transistor is connected with the base of the vertical transistor. The emitter of the vertical transistor is connected to one terminal of a supply voltage source, and the emitter of the lateral transistor is connected to the other terminal of the supply voltage source. A resistance is connected between the base of the lateral transistor and the said one terminal of the supply voltage source.

In order to obtain a smaller surface requirement, several doped regions in the integrated logic are used in multiple form. For instance, a part of the base-emitter junction of the vertical npn transistor is simultaneously the collector-base junction of the lateral pnp transistor connected as a current generator. Thus, a back-injection from the collector of the pnp transistor is produced in the case of a switched out vertical transistor of the preceding inverter stage, which back-injection will lower the base current of the npn transistor. Thus, a higher inverse current gain of the npn transistor is required in order to drive the latter into saturation. This is the case, in particular, since the inverse current gain decreases in the case of small currents. In order to obtain a small power dissipation, however, it is desired to work with small currents. Due to the back-injection which occurs, the noise margin is also decreased.

It is an object of the present invention to avoid the drawbacks of prior art integrated injection logic arrangements.

This objective is attained by an inverter stage of an integrated injection logic, such as the one mentioned above.

An advantage of the invention lies in the fact that the operational point of the inverter stage is changed in such a way that the inverse current gain need be only slightly above 1 during proper operation. The logic can thus be used with very small currents, and the noise margin is larger, with equal current gain.

A further advantage of the invention lies in the fact that the parasitic base currents of the npn transistor are decreased by the base resistance, and thus the inverse current gain is further increased.

Advantageously, the spread of the base-emitter chracteristics can be compensated with the help of the base resistance.

When Schottky clamping diodes are added to the collector-base junction of the npn transistor, the dynamic characteristics of the integrated injection logic are also advantageously improved.

BRIEF DESCRIPTION OF THE DRAWINGS

The invention is explained in the following with the help of the figures and the specification.

DESCRIPTION OF THE PREFERRED EMBODIMENTS

As herein described, the inverter stage of the integrated injection logic is referred to as including a pnp lateral transistor and an npn vertical transistor. It is to be understood, however, that the lateral transistor may be an npn transistor, and the vertical transistor may be a pnp transistor. For convenience and simplicity of description, the lateral transistor will be described as a pnp transistor, and the vertical transistor will be described as an npn transistor.

Figure 1:
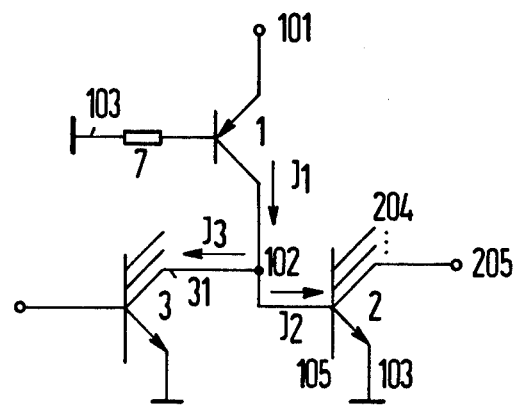
FIG. 1 is a circuit diagram of an inverter stage of the present invention with the npn transistor of the preceding stage.
Figure 2:
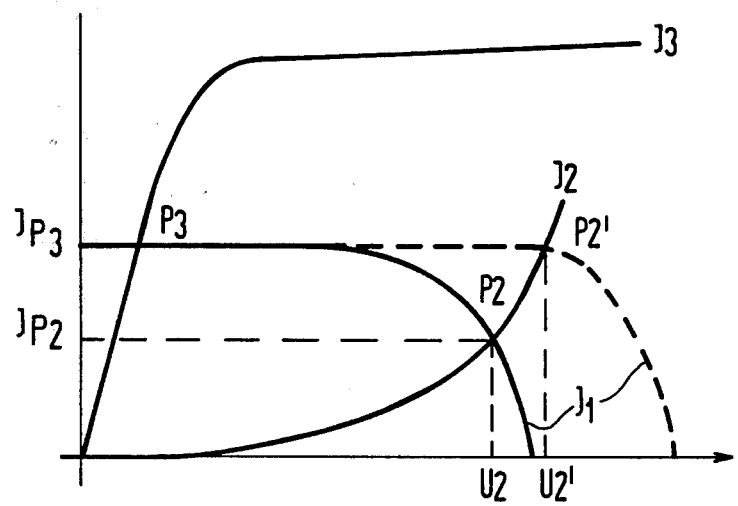
FIG. 2 shows the current characteristics of the transistors of the inverter stage shown in FIG. 1 depending on the voltage of the node.

The inverter stage of the integrated injection logic in accordance with FIG. 1 consists of a lateral pnp transistor 1, called an injector, which is connected as a current generator, and of a vertical pnp transistor 2 with multiple collectors 204 through 205. The vertical npn transistor 3 shown in FIG. 1 belongs to the preceding inverter stage. The injector current $I_1$ flows either towards the base 105 of the npn transistor 2 of the inverter stage shown, or to the collector 31 of the npn transistor 3 of the preceding inverter stage. In FIG. 2, the corresponding transistor characteristic curves and the corresponding operational points $P_2$ and $P_3$ are shown.

In FIG. 2, the current $I_1$ flowing from the collector of the lateral pnp transistor 1 is shown. Thereby, the broken $I_1$ curve is valid for a circuit in accordance with the invention, and the continuous curve for a corresponding circuit of the state of the art. $I_3$ denotes the curve for the collector current which flows in the collector of the vertical npn transistor 3 of the preceding state. $I_2$ denotes the curve for the base current which flows in the vertical npn transistor 2.

The current $I_{P_2}$, i.e. the base current of the transistor 2 at the operational point $P_2$, is smaller than the current $I_{P_3}$. Thereby, the current $I_3$ is the collector current of the transistor 3 at the operational point $P_3$. The back-injection from the collector area of the lateral pnp transistor 1 causes the current difference between the two logic states $P_3$ and $P_2$.

Figure 3:
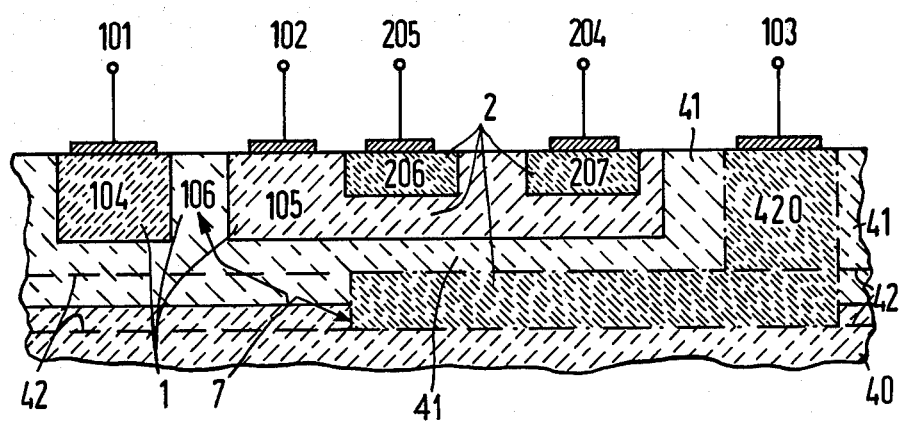
FIG. 3 is a diagrammatic partial sectional view of an inverter stage of one preferred embodiment of the present invention.

FIG. 3 shows a cross-section through the structure of a circuit in accordance with FIG. 1. Therein, detail features of FIG. 3, which have already been denoted in connection with FIG. 1, are provided with corresponding reference numerals. As can be seen from FIG. 3, the base and the collector of the lateral pnp transistor 1 are identical to the emitter and the base, respectively, of the vertical npn transistor.

Figure 4:
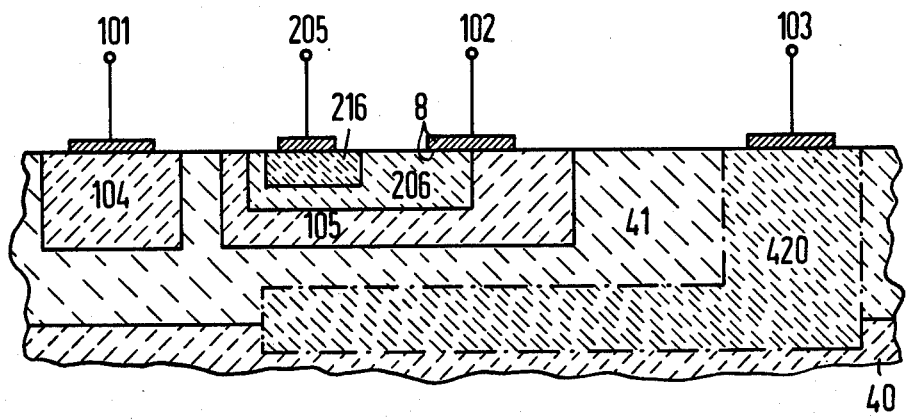
FIG. 4 is a diagrammatic partial sectional view of another preferred embodiment of the present invention in which an I$^2$L structure is provided with a Schottky diode between the base and the collector of the vertical npn transistor.

The supply voltage source is shown in FIGS. 1, 3 and 4 as having two terminals 101 and 103, the latter, in the illustrated embodiments, being more negative than the former. By way of example, and not by way of limitation, the terminal 103 may be ground, while the terminal 101 is positive. Further, the potential at the terminal 103 will be referred to as the reference potential. The lateral pnp transistor 1 has its base connected through a resistor 7 to terminal 103. The supply voltage terminal 101 is connected to the emitter of the lateral transistor 1, while the terminal 102 of the collector of transistor 1 is connected to the base terminal 105 of transistor 2. The emitter of this transistor 2 is connected to the reference potential 103. The vertical transistor 2 is shown as having a plurality of collectors and, by way of illustration, has two collectors. These collectors represent the output of the inverter.

Preferably, such a circuit is constructed as shown in FIG. 3. An n or n− doped layer 41 is epitaxially formed on a silicon substrate 40, which is preferably p doped. The p doped regions 104 and 105 are diffused in this layer 41. Region 104 forms the emitter of transistor 1. This region 104 is connected to supply voltage terminal 101. The collector region 105 of the transistor 1 is connected to the terminal 102, which represents the input of the circuit. The base region 106 of the lateral pnp transistor 1 is located between the regions 104 and 105 and is connected through a resistance region 7 to the reference potential terminal 103 via the buried layer 42. This buried layer 42 which is shown by the broken lines is located below the entire circuit in the case of prior art arrangements. In the present invention, it is doped n+ and the n+ doping ends before the point which lies beneath the collector 105 of the pnp transistor.

The collector region 105 of the lateral pnp transistor 1 serves simultaneously as base area of the vertical pnp transistor 2. The epitaxial layer 41 provides the emitter region of this transistor and it is in contact with reference potential via the terminal 103. The n+ doped regions 206 and 207 are arranged in the region 105, and they represent the collector areas of the vertical transistor 2. The region 206 is connected to the terminal 205, and the region 207 to the terminal 204. In a corresponding manner, several collector regions may be provided. If the npn transistor 2 is to be switched on, its base-emitter junction is biased so far into the forward direction that a forward current flows through the junction. Since this base-emitter junction is simultaneously the collector-base junction of the lateral pnp transistor 1, a back-injection from the collector occurs, and thus the effective collector current decreases, i.e., the base current of the npn transistor 2.

This back-injection has several drawbacks. Since the vertical npn transistor is to be driven into saturation, a current gain essentially above 1 is required. The vertical npn transistor, however, is operated inversely, as can be seen from FIGS. 3 and 4. In standard technology for integrated circuits, it is difficult to obtain a high inverse current gain. This is the case in particular when the relationship between the active area and the full area of the base-emitter junction is so unfavorable as in the represented case.

The demand for a high inverse current gain becomes very critical, in particular, in the case of small currents, since the current gain decreases with small currents. This range, however, is interesting for the application due to its small power dissipation. The back-injection, furthermore, decreases the noise margin, which can be calculated with the help of the following formula:

$$U_{SI} = \frac{k \cdot T}{q} \cdot \ln\beta \frac{I_{P2}}{I_{P3}}$$

where k equals the Boltzmann constant, q equals the elementary charge, T equals the temperature in °K (Kelvin), and β the current gain.

If the back-injection becomes larger, the current ratio $I_{P2}$ to $I_{P3}$ decreases, and thus the noise margin becomes smaller. Since the lateral pnp transistor 1 operates in common base connection, the back-injection can be decreased or prevented by means of a base resistance (reference numeral 7 in FIG. 1) between the areas 420 and 106. With a base resistance, the characteristic curve in FIG. 2 shifts in accordance with the broken line of $I_1$. The shift of the characteristic curve is larger when the base resistance becomes larger. Due to the change of the characteristic, the operational point shifts from $P_2$ to $P_2'$, and the voltage increases correspondingly from $U_2$ to $U_2'$. In the case of a sufficiently large base resistance, the optimum state may be obtained whereby the injector current is equal in both logic states. In this optimum case, the inverse current gain should be somewhat above 1. This requirement can be easily fulfilled with any well known technology, and thus, the compatibility of the integrated injection logic with any desired integrated digital or analog circuit is obtained. On the other hand, the application boundary is shifted outwardly (increased), which is determined by the decrease of the current gain in the case of smaller currents.

In addition, the noise margin reaches the maximum possible value in the case of equal current gain. Since the current ration $I_{P2}/I_{P3}$ equals 1 is obtained, the above stated equation for the noise margin is simplified to be:

$$U_{SI} = \frac{k \cdot T}{q} \cdot \ln\beta.$$

The base resistance may be obtained as shown in FIG. 3, by the n epitaxial layer 41, which is doped to be of high resistivity. Below the vertical npn transistor, there is situated a buried layer 420, shown by the heavy shading between the dotted lines, and it is n+ doped. Thus buried layer 420 is connected to the terminal 03 through the n+ doped region 421, the terminal 103 being connected to the reference potential.

In FIG. 4 a further embodiment is shown, in which the dynamic properties are also substantially improved. Detailed features of FIG. 4, which have already been described in connection with FIG. 3, have the corresponding reference numerals. Aside from the base resistance in accordance with the invention, a Schottky clamping diode 8 as described in my application, Ser. No. 700,510, filed June 28, 1976, and assigned to the same assignee as the present invention, is additionally connected between the collector 206 and the base 105 of the npn transistor 2. This diode is formed by the junction between the collector area 206 and the electrode 102 of the base area. The collector terminal area 216, which is provided with the electrode 206, is arranged in the collector area 206. If the buried layer 420 reaches only to the last collector area of the transistor 2, as shown in FIGS. 3 and 4, the residual portion of the base-emitter junction towards the lateral pnp transistor 1 will be biased in the forward direction; but the voltage will decrease at this portion of the pn junction due to the base resistance. Thus, not only the referse injection from the collector of the lateral pnp transistor 1 is eliminated, but also parasitic currents of the base-emitter junction of the vertical npn transistor 2 will also decrease. This also causes an increase of the inverse current gain.

The prevention of the back-injection in accordance with the invention is also favorable for the dynamic properties, since the charge accumulated in the base, and thus the storage time of the lateral pnp transistor 1 becomes smaller.

It will be apparent to those skilled in the art that many modifications and variations may be effected without departing from the spirit and scope of the novel concepts of the present invention.

I claim as my invention:

1. An inverter comprising a lateral bipolar transistor and a vertical bipolar transistor, said vertical transistor having at least one collector, the collector of said lateral transistor being connected to the base of said vertical transistor, the emitter of said vertical transistor being connected to one terminal of a supply voltage source, the emitter of said lateral transistor being connected to the other terminal of said supply voltage source, and a resistor connecting said one terminal of the supply voltage source to the base of said lateral transistor, in which a first doped layer of a first conductivity type is deposited epitaxially upon a doped substrate of the opposite conductivity type, said emitter and said collector of said lateral transistor being first and second diffused regions in the upper surface of said epitaxial layer which provide, respectively, the emitter and collector of said lateral transistor and which are separated from one another by a portion of said epitaxial layer which provides the base of said lateral transistor, first and second doped regions being provided in the upper surface of said second diffused region, said two doped regions being the collectors of said vertical transistor, a highly doped buried layer of the first conductivity type being provided in said epitaxial layer below said vertical transistor with the exception of part of said vertical transistor being adjacent to the base of said lateral transistor which, by means of a doped terminal region provides a conductive path to said emitter region of said vertical transistor from said one terminal of said supply voltage source, said buried layer and said terminal region also providing a conductive path to said base region of said lateral transistor from said one terminal of said supply voltage source through a portion of said epitaxial layer which provides a resistance element inserted serially between said base region of said lateral transistor and said one terminal of said supply voltage source.

2. An inverter comprising a lateral bipolar transistor and a vertical bipolar transistor, said vertical transistor having at least one collector, the collector of said lateral transistor being connected to the base of said vertical transistor, the emitter of said vertical transistor being connected to one terminal of a supply voltage source, the emitter of said lateral transistor being connected to the other terminal of said supply voltage source, and a resistor connecting said one terminal of the supply voltage source to the base of said lateral transistor, in which a first doped layer of a first conductivity type is deposited epitaxially upon a doped substrate of the opposite conductivity type, said emitter and said collector of said lateral transistor being first and second diffused regions in the upper surface of said epitaxial layer which provide, respectively, the emitter and collector of said lateral transistor and which are separated from one another by a portion of said epitaxial layer which provides the base of said lateral transistor, first and second doped regions being provided in the upper surface of said second diffused region, said two doped regions being the collectors of said vertical transistor, a highly doped buried layer of the first conductivity type being provided in said epitaxial layer below said vertical transistor with the exception of part of said vertical transistor being adjacent to the base of said lateral transistor which, by means of a doped terminal region provides a conductive path to said emitter region of said vertical transistor from said one terminal of said supply voltage source, said buried layer and said terminal region also providing a conductive path to said base region of said lateral transistor from said one terminal of said supply voltage source through a portion of said epitaxial layer which provides a resistance element inserted serially between said base region of said lateral transistor and said one terminal of said supply voltage source, in which Schottky clamping diodes are provided parallel to the base-collector junctions of said vertical transistor, wherein a doped collector terminal region is provided in a collector region, and wherein a metal electrode is provided at the boundary surface between said first collector region and said base region at the surface of said epitaxial layer, which metal electrode is positioned partially above said first doped region and partially above said base region which forms the Schottky diode together with said first doped region.

3. An inverter comprising a lateral bipolar transistor and a vertical bipolar transistor, said vertical transistor having at least one collector, the collector of said lateral transistor being connected to the base of said vertical transistor, the emitter of said vertical transistor being connected to one terminal of a supply voltage source, the emitter of said lateral transistor being connected to the other terminal of said supply voltage source, and a resistor connecting said one terminal of the supply voltage source to the base of said lateral transistor, in which a first doped layer of a first conductivity type is deposited epitaxially upon a doped substrate of the opposite conductivity type, said emitter and said collector of said lateral transistor being first and second diffused regions in the upper surface of said epitaxial layer which provide, respectively, the emitter and collector of said lateral transistor and which are separated from one another by a portion of said epitaxial layer which provides the base of said lateral transistor, first and second doped regions being provided in the upper surface of said second diffused region, said two doped regions being the collectors of said vertical transistor, a highly doped buried layer of the first conductivity type being provided in said epitaxial layer below said vertical transistor with the exception of part of said vertical transistor being adjacent to the base of said lateral transistor which, by means of a doped terminal region provides a conductive path to said emitter region of said vertical transistor from said one terminal of said supply voltage source, said buried layer and said terminal region also providing a conductive path to said base region of said lateral transistor from said one terminal of said supply voltage source through a portion of said epitaxial layer which provides a resistance element inserted serially between said base region of said lateral transistor and said one terminal of said supply voltage source, and in which of said two transistors only the vertical transistor has said buried layer lying therebelow.

* * * * *